United States Patent [19]

Barth

[11] 4,425,544
[45] Jan. 10, 1984

[54] DUAL-GATE DEEP-DEPLETION TECHNIQUE FOR CARRIER-GENERATION-LIFETIME MEASUREMENT

[75] Inventor: Phillip W. Barth, Palo Alto, Calif.

[73] Assignee: The United States of America as represented by the Secretary of the Navy, Washington, D.C.

[21] Appl. No.: 241,307

[22] Filed: Mar. 6, 1981

[51] Int. Cl.³ .......................................... G01R 31/26
[52] U.S. Cl. ............................ 324/158 D; 324/158 T
[58] Field of Search ........................ 324/158 D, 158 T

[56] References Cited
U.S. PATENT DOCUMENTS
4,090,132  5/1978  Alexander ...................... 324/158 D Primary Examiner—Ernest F. Karlsen
Attorney, Agent, or Firm—R. F. Beers; Charles D. B. Curry; William C. Daubenspeck

[57] ABSTRACT

A method for investigating the quality of dielectrically isolated thin film semiconductor layers in inversion-mode MOS devices having dual-gate control capabilities which allow two channels to be created in the semiconductor film. With one channel conducting and a drain voltage providing operation in the saturation region, a step voltage is applied to the gate associated with the second channel which has a transient effect on the current in the first channel. This transient may be analyzed to measure the generation lifetime and other parameters in the body of the device.

5 Claims, 4 Drawing Figures

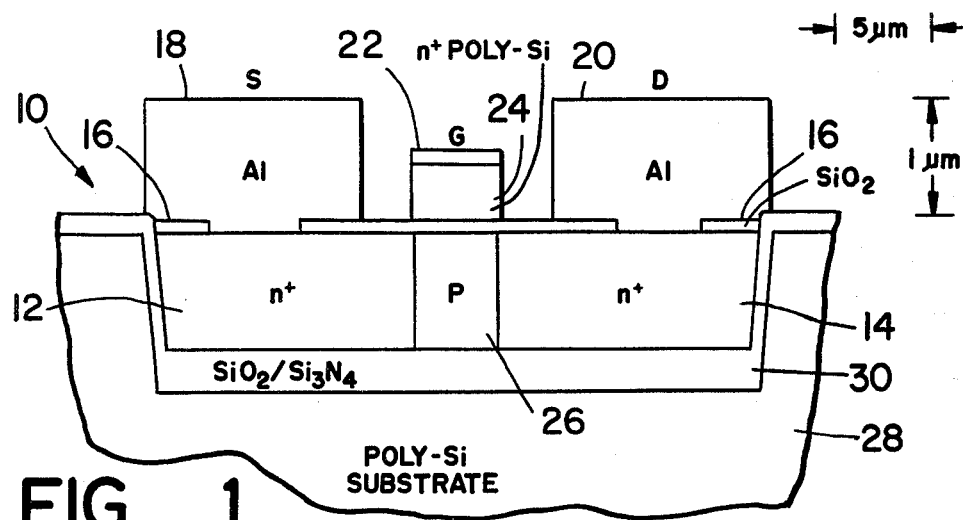
FIG_1
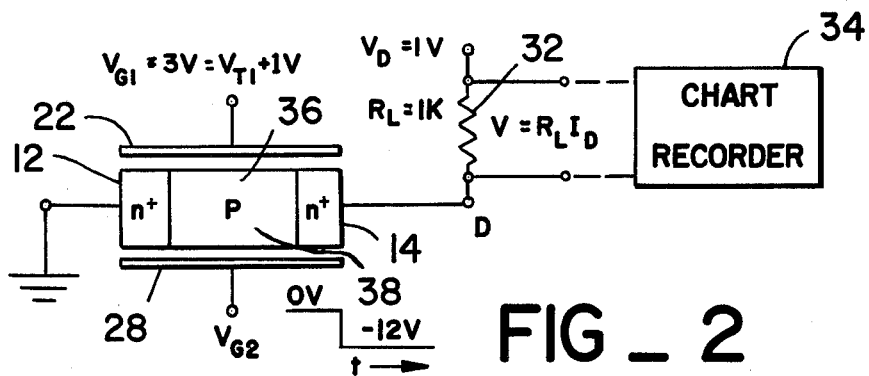
FIG_2
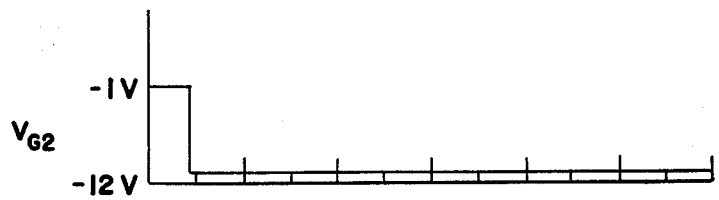
FIG_3A
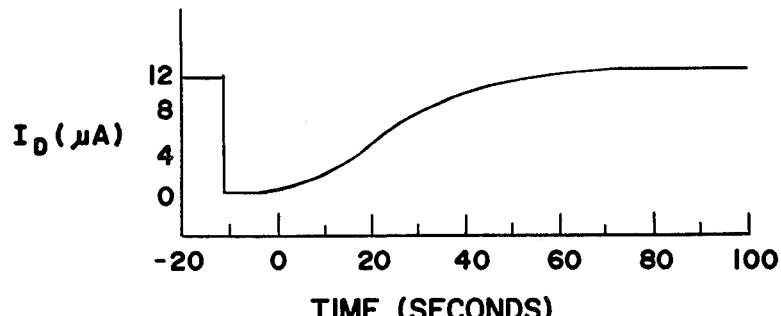
FIG_3B

DUAL-GATE DEEP-DEPLETION TECHNIQUE FOR CARRIER-GENERATION-LIFETIME MEASUREMENT

BACKGROUND OF THE INVENTION

1. Field of the Invention

This invention relates in general to metal-oxide-semiconductor (MOS) devices and, in particular, to inversion-mode MOS devices having dielectrically isolated semiconductor layers. More particularly, the present invention relates to a method for measuring the carrier generation lifetime and other parameters in these dielectrically isolated layers by using a dual-gate deep-depletion effect.

2. Description of the Prior Art

The quality of dielectrically isolated semiconductor layers is of critical importance in the operation of MOS devices employing these layers. The carrier generation lifetime of these layers is an important parameter in the device design and is also a good indication of layer quality since carrier lifetime is particularly sensitive to crystal quality and impurity concentrations. It would be very useful to have a convenient and accurate technique for lifetime measurement in order to develop clear-cut lifetime profiles as a function of deposition and processing parameters or monitor device quality.

For many reasons, lifetime is difficult to measure and results are difficult to interpret, especially in thin silicon films. In general, the presently available methods for measuring lifetime are not satisfactory for inversion-type devices. One commonly used technique to measure generation lifetime is the transient deep-depletion capacitance technique (F. P. Heiman, "On the determination of minority carrier lifetime from the transient response of an MOS capacitor," IEEE Trans. Electron Devices, vol. ED-14, pp. 781-784, Nov. 1967), in which a large-area MOS capacitor is pulsed into depletion. Generation lifetime is found by monitoring the capacitance change of the structure with time as an inversion layer becomes established under the MOS gate. This technique is not well suited for thin semiconductor films in which the depletion region width is comparable to the layer thickness, because series-resistance effects between the edges and the center of the capacitor seriously degrade measurement accuracy. In addition, the large size required of the MOS capacitor for good measurement accuracy may preclude its use as a test device on most integrated circuit chips.

Another technique previously used for generation lifetime measurement in thin silicon films was developed by Kamins (T. I. Kamins, "Minority carrier lifetime in dielectrically isolated single-crystal silicon films defined by electrochemical etching," Solid-State Electron., vol. 17, pp. 675-681, 1974), using deep-depletion MOS transistors. In such devices, there are no p-n junctions, and current flow occurs in the undepleted bulk of the transistor body. In such a structure, a depletion-type voltage pulse on the upper gate of the transistor will constrict the channel region, reducing drain current. As an inversion layer is established under the gate by bulk thermal generation, surface generation, or photoinjection, the depletion width decreases and the channel region widens. Lifetime can be estimated by monitoring the drain current. Since this technique is a single-gate technique, it is a useful method for measuring lifetime in deep-depletion devices but is not suitable for inversion-type devices.

SUMMARY OF THE INVENTION

The present invention provides a convenient and accurate method for measuring the carrier generation lifetime in dielectrically isolated semiconductor layers. The present invention is applicable to inversion-type transistors (p- or n-channel) fabricated in any type of thin semiconductor film as long as the transistor body is isolated except for the drain-source junctions and some type of dual gate control is available which allows two parallel channels to be created in the semiconductor film. Voltage may be applied to the device such that a transient effect may be induced in the channels which may be used to measure carrier generation lifetime due to thermal generation, surface generation or other parameters.

As an illustrative example, the generation lifetime in a dielectrically isolated semiconductor layer in an inversion-mode n-channel MOS transistor is measured as follows: An initial equilibrium state is established by applying (1) a voltage to the drain large enough to place the device in the saturation region of operation without causing avalanche injection, (2) a voltage to the gate which is greater than the equilibrium threshold voltage which is required to turn on the channel associated with the gate and (3) a voltage to the substrate (which acts as a second gate) which is less than the threshold voltage necessary to turn on the second channel. The drain current is continuously measured and recorded by suitable means such as a voltage across a load resistance monitored by a chart recorder. Then the voltage applied to the second gate (substrate) is suddenly stepped in the negative direction. The drain current has a characteristic transient response to the stepped voltage from which the generation lifetime of the semiconductor layer may be determined. If carrier generation is dominated by thermal generation, the drain current goes to zero, stays at zero for a period of time, and then recovers to its original value in a quasi-exponential fashion. The recovery time constant $\tau_R$, which is the time when the drain current recovers approximately 40 percent of its final value, is a function of the generation lifetime $\tau_G$, the acceptor concentration $N_A$ in the transistor body, and the intrinsic carrier concentration $n_i$ according to $\tau_R = \tau_G \times 2N_A/n_i$ so that the generation lifetime may be easily calculated.

Avalanche injection from the drain, photogeneration within the transistor, or surface generation at either surface of the channel region also produce characteristic transient responses in the drain current which may be used to determine generation lifetime due to these mechanisms and thus measure the quality of the device.

Because the deep-depletion transient effect is sensitive to photogeneration within the device, the present invention may also provide a photodetective device.

Other advantages and features of the present invention will become apparent from the following detailed description of the invention when considered in conjunction with the accompanying drawings wherein:

BRIEF DESCRIPTION OF THE DRAWINGS

FIG. 1 is a cross-sectional view of an inversion-mode MOS transistor having a structure which produces the deep-depletion effect utilized by the present invention.

FIG. 2 is a schematic drawing illustrating an experimental set up for lifetime measurement according to the present invention.

FIGS. 3a and 3b are plots of the lower gate applied voltage and the upper channel drain current, respectively, versus time.

DESCRIPTION OF THE PREFERRED EMBODIMENT

The dual-gate, deep-depletion technique for measuring generation lifetime will be described in connection with the dielectrically isolated, n-channel, inversion-mode, MOS transistor (DI/NMOST) 10 shown in FIG. 1. The transistor 10 includes an n-type source region 12 and an n-type drain region 14 disposed below an insulating silicon dioxide layer 16 and in contact with source and drain terminals 18 and 20, respectively. A gate terminal 22 is in contact with semi-insulating polycrystalline silicon (poly-Si) layer 24 which is disposed on the insulating layer 16 over the p-type channel region 26. The transistor body is supported by a semi-insulating poly-Si substrate 28 with an intervening insulator 30 composed of silicon dioxide ($SiO_2$) and silicon nitride ($SiN_4$) layers. The lower insulator 30 is electrically accessible by a voltage applied to the semi-insulating substrate 28 so that the lower insulator may form a second MOS gate. The transistor 10 is thus an MISIM (Metal-Insulator-Semiconductor-Insulator-Metal) type device with unique current voltage characteristics. The present invention is based on a transient deep depletion effect which has been observed in the DI/NMOST structure of FIG. 1 and which can be used for the measurement of generation lifetime within the transistor body.

FIG. 2 shows a circuit in which the DI/NMOST 10 (shown schematically) may be placed to observe the dual-gate deep-depletion transient effect and determine the generation lifetime. With the source terminal 18 coupled to ground, voltages are applied to the drain terminal 20, the upper gate terminal 22, and the poly-Si substrate 28 (the lower gate). A first equilibrium state is established in which the applied drain voltage $V_d$ is large enough to place the device in the saturation region of operation without causing avalanche injection from the drain 14, the applied upper gate voltage $V_{G1}$ is greater than the upper gate equilibrium threshold voltage $V_{T1}$ which is defined as the voltage required to turn on the upper channel, and the applied substrate voltage $V_{G2}$ is less than the lower gate threshold voltage $V_{T2}$ which is defined as the voltage required to turn on the lower channel. It should be noted that the applied drain voltage $V_d$ may be less than that required to place the device in saturation; however, the determination of the generation lifetime is simplified if $V_d$ establishes saturation. Similarly, the lower channel may be slightly turned on in the first equilibrium state, but this also complicates the determination of the generation lifetime. Drain current $I_D$ is measured as the voltage across a load resistor 32, and is recorded by a chart recorder 34. When $V_{G2}$ is suddenly stepped in a negative direction as illustrated in FIG. 3a, the characteristic response of FIG. 3b is observed: the drain current $I_D$ goes to zero, stays at zero for a period of time, and then recovers to its original equilibrium value in a quasi-exponential fashion. The curves shown in FIGS. 3a and 3b were experimentally obtained for a DI/NMOST in the circuit of FIG. 2 with the applied voltage as shown.

As will be discussed herein after, the characteristic curve shown in FIG. 3b is produced when the carrier generation is primarily due to thermal generation. If the recovery transient is dominated by avalanche injection from the drain, photogeneration in the transistor, or surface generation at either upper or lower surfaces, a different characteristic drain current will be produced so that generation rate due to these effects may also be measured.

The events occurring in the transistor body upon the application of the negative voltage step are as follows. Before the step is applied, an inversion layer exists at the upper surface channel region 36, while an accumulation layer exists at the lower channel 38. The neutral body of the transistor is electrically floating, except for its connection to ground through the body-source p-n junction and its connection to the drain through the reverse-biased drain-body junction. Upon application of a negative step to the substrate 28, the lower-channel surface potential decreases, as does the potential of the transistor body. The body voltage falls below ground, leaving both the body-source and drain-body junctions back biased. The depletion layer under the upper channel 36 widens as the body voltage falls, resulting in a decrease in upper-channel inversion-layer charge. If the magnitude of the lower-gate voltage step is large enough, the upper-channel inversion charge will disappear completely, and the upper channel 36 will be turned off.

In the absence of hole injection from either the source or drain p-n junctions, the only means by which equilibrium can be restored is by carrier generation within the transistor body. If such generation is limited to thermal generation, recovery will take a fairly long time. The final equilibrium situation results in a re-established upper-channel inversion layer, a body voltage of zero, and a larger accumulation charge on the lower channel than before the voltage step was applied.

The presence of light has been seen to hasten the recovery phase of the transient, supporting the contention that recovery is due to carrier generation; additionally, recovery is faster at high drain voltages, due to avalanche injection across the back-biased drain-body diode.

ANALYSIS OF THE RECOVERY TRANSIENT

The inversion layer in the upper channel 36 is re-established when the surface potential at the source 12 reaches $2\phi p$, where $\phi p=(kT/q)\ln(N_A/n_i)$ is the position of the Fermi level in the transistor body at equilibrium, referenced to the intrinsic Fermi level (k is Boltzmann's constant, T is the absolute temperature, q is the magnitude of the electron charge, $N_A$ is the acceptor concentration in the transistor body, and $n_i$ is the intrinsic carrier concentration). At this time, the transistor will be in the saturation region of operation (i.e., $V_d > V_{d\,sat}$) for any drain voltage $V_d$. If $V_d$ is set so that $V_d > V_{d\,sat}$ at t=infinity, then the entire recovery transient will occur in the saturation region; this is the situation presented here.

The charge per unit area in the invention layer near the source during the transient is given by $$Q_n(t) = [W(t) - W_i]qN_A \qquad (1)$$

where W is the depletion region width and $W_i$ is its value at time t=0. This initial value is found from $$Q_n(O) = 0 = -(V_{G1} - V_{FB1} - 2\phi p)C_{01} + qN_A W \qquad (2)$$

(where $V_{FB1}$ is the flat-band voltage of the top channel, and $C_{01}$ is the capacitance per unit area of the front gate) giving $$W_i = \frac{C_{01}(V_{G1} - V_{FB1} - 2\phi_p)}{qN_A} \quad (3)$$

The width of the depletion region decays toward a final value $W_F = x_{dmo}$, where $x_{dmo}$ is the maximum-depletion region width in thermal equilibrium. The rate of change of W is given by $$\frac{dW}{dt} = \frac{G(W - W_F)}{N_A} \quad (4)$$

where G is the carrier-generation rate, averaged over the thickness of the silicon layer. If no generation mechanism other than bulk thermal generation is present, then $G = n_i/(\tau_p + \tau_n)$, where $\tau_p$ and $\tau_n$ are the hole and electron generation lifetimes. The Fermi level in the depletion region is located near midband, so that given generation centers located near midband we will have $\tau_p \approx \tau_n$, and both quantities can be expressed by a single generation lifetime $\tau_G$. Equation (4), therefore, becomes $$\frac{dW}{dt} = \frac{n_i}{N_A} \frac{1}{2\tau_G} (W - W_F) \quad (5)$$

which has a solution $$W(t) = (W_i - W_F)e^{-t/\tau_R} + W_F \quad (6)$$

where $\tau_R = \tau_G \times 2N_A/n_i$ is the recovery time constant for the depletion-layer width. For $V_d > V_{d\,sat}$, it is possible to show, using first-order MOS theory, that the front-channel current that is given by $$I_{D1}(t) = K[W_i - W(t)]^2 \quad (7)$$

where K is a constant. Substituting from (6) into (7) gives $$I_{D1}(t) = K(W_i - W_F)^2 (1 - 2e^{-t/\tau_R} + e^{-2t/\tau_R}). \quad (8)$$

The time constant $\tau_R$ can be found by noting that at $t = \tau_R$, the current $I_{D1}$ will have recovered to approximately 40 percent of its final value (at $t = \alpha$) (substituting $t = \tau_R$ into equation (8)). The time constant $\tau_R$ can now be found, by inspection, from FIG. 3b. Since $\tau_R = \tau_G \times 2N_A/n_i$, the carrier generation lietime can easily be calculated if the acceptor concentration $N_A$ and the intrinsic carrier concentration $n_i$ are known.

ANALYSIS OF TIME DURING WHICH DRAIN CURRENT IS ZERO

The initial charge which is drawn to the back gate of the DI/NMOST upon application of a negative voltage pulse $\Delta V_{G2}$ to Gate 2 is given by $\Delta Q_0 = C_{02}(\Delta V_{G2} - V_{BO})$, where $V_{BO}$ is the voltage to which the transistor body falls ($V_{BO} < O$) upon application of the pulse and $C_{02}$ is the back-gate capacitance per unit area. This charge is pulled out of the neutral body region of the transistor, leaving a charge of equal magnitude in the widened depletion layer; i.e., $\Delta Q_0 = -qN_A(W_O - W_F)$ where $W_O$ is the maximum width of the depletion region. $V_{BO}$ is thus $$V_{BO} = \frac{qN_A}{C_{02}} (W_O - W_F) + \Delta V_{G2} \quad (9)$$

There exists another relation between $V_{BO}$ and $W_O$, i.e., $$W_O = \sqrt{\frac{2\epsilon_s}{qN_A} (2\phi_{Fp} - V_{BO})} \quad (10)$$

Combining (9) and (10) allows a solution for $W_O$ $$W_O = -\frac{\epsilon_s}{C_{02}} + \sqrt{\left(\frac{\epsilon_s}{C_{02}}\right)^2 + \frac{2\epsilon_s W_f}{C_{02}} + \frac{2\epsilon_s}{qN_A} (2\phi_{Fp} - \Delta V_{G2})} \quad (11)$$

The variation of W with time is the same as in (6), giving $$W_O = W(-t_{OFF}) = (W_i - W_f)e^{-(-t_{OFF})/\tau_R} + W_f \quad (12)$$

Solving for $t_{OFF}$ then given $$t_{OFF} = \tau_R \ln \frac{W_O - W_f}{W_i - W_f} \quad (13)$$

The measured value of $t_{OFF}$ from FIG. 3b is 13 s at $\Delta V_{G2} = -11$ V; This value is in contrast to a calculated value of $t_{OFF} = 93$ s from (13), indicating that $t_{OFF}$ cannot be accounted for solely by bulk carrier generation. Since the carrier concentration at the back surface is fairly low for $0 < t < t_{OFF}$, a high surface generation rate is to be expected. This surface generation dominates $t_{OFF}$, lowering it by an order of magnitude.

The accurate measurement of $\tau_g$ by this deep-depletion technique, in any device, is possible only when the recovery transient is not dominated by avalanche injection from the drain, photogeneration within the transistor, or surface generation at either upper or lower surfaces. Shortened recovery transients have been observed due to all three of these extra effects. Unlike bulk thermal generation, these effects all result in a linear change of W with time, and a parabolic variation of drain current with time for $V_d > V_{d\,sat}$.

Surface generation at the accumulated surface in the DI/NMOST (lower surface in the situation analyzed above) can be controlled by pulsing that surface heavily into accumulation, so that the hole concentration $P_p$ is much greater than the equilibrium concentration $P_{pO}$, and the surface generation rate approaches zero. The other surface of the silicon, however, is either depleted or lightly inverted during the recovery transient, and surface generation there is at a maximum. In the DI/NMOST, front-surface generation has not been seen to dominate the recovery transient. However, if the measurement setup is reversed, so that the upper gate is pulsed while lower-channel current is measured, the measured recovery time is only 1-2 s. This short recovery time is consistent with the short $t_{OFF}$ measured from FIG. 3, which is also attributed to lower-surface generation where the lower channel is only lightly accumulated.

As noted earlier, the present invention may also be used to monitor device quality by measuring the avalanche injection from the drain, photogeneration within the transistor or surface generation at either the upper or lower surfaces in addition to the thermal generation. The methods used to monitor the foregoing effects are substantially the same as that used to monitor the thermal generation. Referring again to FIG. 2, the avalanche injection from the drain, which is an indication of the quality of the body-drain p-n junction, may be measured as follows. A first equilibrium state in which the applied upper gate voltage $V_{G1}$ is greater than the upper channel threshold voltage and the applied lower gate voltage $V_{G2}$ is less than the lower channel threshold voltage is established for a range of applied drain voltages $V_d$. For each drain voltage $V_d$, a negative step is applied to the lower channel and the resulting transient in the drain current recorded. This series of recovery transients at various drain voltages may be analysed to determine the avalanche injection from the drain.

To monitor the surface generation at, for example, the lower surface, an initial equilibrium state is established with the applied drain voltage in the saturation region, the upper channel turned on, and the lower channel turned off. However, in this case the negative step applied to the lower gate will be of a lesser magnitude than if the thermal generation were being measured. For the proper values of applied step voltage, the recovery transient will be dominated by surface generation effects. To monitor the upper surface generation, the same method is used but the application of voltage to the upper and lower gates is reversed.

Photogeneration within the device will also produce a characteristic response when light strikes the device during the recovery transient. The transient may be analysed to determine the photogeneration contribution to the transient. It is noted that the circuit of FIG. 2 constitutes a photosensor when light strikes the transistor during a recovery transient. The recovery transient can be calibrated to indicate the intensity of light falling on the device.

It should be noted that the method of the present invention should be readily applicable to MISIM structures in other technologies such as laser-annealed polysilicon on insulator silicon or silicon-on-sapphire films.

What is claimed is:

1. A method for measuring the carrier generation lifetime in an inversion mode MOS device of the type having a dielectrically isolated thin film semiconductor and having a capability of dual gate control, which comprises the steps of:
    (a) establishing a first equilibrium state of said device by:
        (1) applying a voltage to a first gate control which is greater than the equilibrium threshold voltage of the channel associated with said first gate control;
        (2) applying a voltage to the second gate control which is less than the threshold voltage of the channel associated with said second gate control; and
        (3) applying a voltage to the drain of said device so that said device is in the saturation region of operation during said first equilibrium state; and
        (4) coupling the source of said device to circuit ground;
    (b) applying a step voltage to the second gate control which is large enough to turn off the channel associated with the first gate control; and
    (c) measuring the drain current during steps (a) and (b), said step of applying a step voltage producing a characteristic transient effect in said drain current, the recovery time constant of said transient effect being related to the carrier generation lifetime in said device according to the relationship $\tau_R = \tau_G \times 2N_A/n_i$ where $\tau_R$ is the recovery time constant, $\tau_G$ is the carrier generation lifetime, $N_A$ is the acceptor concentration, and $n_i$ is the intrinsic carrier concentration.

2. Method for investigating the quality of the dielectrically isolated semiconductor layer in an inversion mode Metal-Insulator-Semiconductor-Insulator-Metal (MISIM) type transistor having dual gate control, which comprises the steps of:
    (a) establishing a first equilibrium state of said transistor by:
        (1) applying a voltage to a first gate control which is greater than the equilibrium threshold voltage of the channel associated with said first gate control;
        (2) applying a voltage to the second gate control which is less than the threshold voltage of the channel associated with said second gate control;
        (3) applying a voltage to the drain of said device so that said transistor is in the saturation region of operation during said first equilibrium state; and
        (4) coupling the source of said transistor to circuit ground;
    (b) applying a step voltage to the second gate control; and
    (c) measuring the drain current during steps (a) and (b), said step of applying a step voltage producing a characteristic transient effect in said drain current, the recovery time constant of said transient effect being related to the carrier generation lifetime of said transistor according to the relationship $\tau_R = \tau_G \times 2N_A/n_i$ where $\tau_R$ is the recovery time constant, $\tau_G$ is the carrier generation lifetime, $N_A$ is the acceptor concentration, and $n_i$ is the intrinsic carrier concentration.

3. A method recited in claim 2 wherein the bulk thermal generation lifetime of said semiconductor layer is measured wherein step (b) comprises the step of:
    (a) applying a step voltage to the second gate which is large enough to turnoff the channel associated with the first gate, the recovery time constant of said transient effect being related to the thermal carrier generation lifetime in said semiconductor layer.

4. A method as recited in claim 2 wherein the surface generation lifetime of said semiconductor layer is measured wherein step (b) comprises the step of:
    (a) applying a step voltage to the second gate so that the surface of the semiconductor layer proximate to the second gate is initially either depleted or lightly inverted, the recovery transient being related to the surface carrier generation lifetime in said proximate surface.

5. A method as recited in claim 2 wherein the avalanche injection properties of the body-drain injection are investigated, said method further comprising steps of:
    (a) repeating steps (a), (b), and (c) while varying the magnitude of the voltage applied to the drain of said trnsistor.

* * * * *